(12) United States Patent
Lee et al.

(10) Patent No.: US 10,873,058 B2
(45) Date of Patent: Dec. 22, 2020

(54) ROLL-TO-ROLL SUBSTRATE DEPOSITION APPARATUS

(71) Applicant: LG DISPLAY CO., LTD., Seoul (KR)

(72) Inventors: Shin-Bok Lee, Seoul (KR); Tae-Joon Song, Paju-si (KR); Nam-Kook Kim, Suwon-si (KR); Soon-Sung Yoo, Goyang-si (KR); Hwan-Keon Lee, Daejeon (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/826,373

(22) Filed: Nov. 29, 2017

(65) Prior Publication Data

US 2018/0151851 A1  May 31, 2018

(30) Foreign Application Priority Data

Nov. 30, 2016 (KR) .................. 10-2016-0162013

(51) Int. Cl.
| | |
|---|---|
| *H01L 51/56* | (2006.01) |
| *B05C 1/08* | (2006.01) |
| *H01L 51/00* | (2006.01) |
| *C23C 14/56* | (2006.01) |
| *C23C 16/04* | (2006.01) |
| *C23C 16/54* | (2006.01) |
| *C23C 14/04* | (2006.01) |

(52) U.S. Cl.
CPC ............... *H01L 51/56* (2013.01); *B05C 1/08* (2013.01); *C23C 14/042* (2013.01); *C23C 14/562* (2013.01); *C23C 16/042* (2013.01); *C23C 16/545* (2013.01); *H01L 51/0097* (2013.01); *H01L 51/0011* (2013.01)

(58) Field of Classification Search
None
See application file for complete search history.

(56) References Cited

U.S. PATENT DOCUMENTS

| | | | | |
|---|---|---|---|---|
| 3,227,132 | A * | 1/1966 | Clough | .................... C23C 14/24 |
| | | | | 118/733 |
| 4,492,181 | A * | 1/1985 | Ovshinsky | ............ C23C 16/505 |
| | | | | 118/718 |
| 5,976,257 | A * | 11/1999 | Kanai | ..................... C23C 16/46 |
| | | | | 118/718 |
| 9,388,488 | B2 | 7/2016 | Lee et al. | |
| 2007/0026141 | A1 | 2/2007 | Nakayama et al. | |

FOREIGN PATENT DOCUMENTS

| | | |
|---|---|---|
| CN | 204898061 U | 12/2015 |
| CN | 105549321 A | 5/2016 |
| JP | 59-178626 A | 10/1984 |
| JP | 62-67171 A | 3/1987 |
| WO | 2017/140052 A1 | 8/2017 |

\* cited by examiner

*Primary Examiner* — Jethro M. Pence
(74) *Attorney, Agent, or Firm* — Seed Intellectual Property Law Group LLP

(57) ABSTRACT

Disclosed is a roll-to-roll substrate deposition apparatus which may control the width and length of a deposition area so as to adjust the size of a thin film. The roll-to-roll substrate deposition apparatus includes a deposition area controller disposed between a flexible substrate supplied to the inside of a chamber and a deposition unit supplying a deposition material to the flexible substrate so as to adjust the width and length of a thin film formed of the deposition material on one surface of the flexible substrate.

18 Claims, 11 Drawing Sheets

ROLL-TO-ROLL SUBSTRATE DEPOSITION APPARATUS

This application claims the benefit of Korean Patent Application No. 10-2016-0162013, filed on Nov. 30, 2016, which is hereby incorporated by reference as if fully set forth herein.

BACKGROUND

Technical Field

The present disclosure relates to a roll-to-roll substrate deposition apparatus, and more particularly, to a roll-to-roll substrate deposition apparatus which may control the width and length of a deposition area so as to adjust the size of a thin film.

Description of the Related Art

Recently, due to development of digital technology, next-generation display devices are being vigorously developed centering on research on high performance of flat displays which are commercialized now, such as a touch panel, an OLED, etc. Thereamong, a flexible display device, which is bendable or foldable without causing loss of characteristics of the display device, is not only used as a substitute for a conventional flat display device but also applied to a next-generation display device, such as e-paper.

A flexible display device is formed by depositing a thin film, such as an organic light emitting diode, on a flexible substrate, such as a film. The flexible display device is formed in a roll-to-roll manner in which the deposition process is successively carried out under the condition that the flexible substrate is wound on a roll.

FIG. 1 is a view schematically illustrating a conventional roll-to-roll substrate deposition apparatus.

As shown in FIG. 1, the conventional roll-to-roll substrate deposition apparatus includes one or more deposition units 20 disposed in a chamber 10. The roll-to-roll substrate deposition apparatus receives a flexible substrate 50 wound on an external unwinding roller 30, forms a designated thin film on one surface of the flexible substrate 50, and then outputs the flexible substrate 50 to an external rewinding roller 40. Here, the deposition unit 20 in the chamber 10 supplies a deposition material to one surface of the flexible substrate 50 moving through a transfer roller 15 and, thus, the designated thin film is formed on the surface of the flexible substrate 50. Here, non-described reference numerals 35 and 45 respectively indicate guide rollers which guide and transfer the flexible substrate 50.

However, the conventional roll-to-roll substrate deposition apparatus cannot control a deposition area of the deposition material supplied from the deposition unit 20 and, thus, the deposition material is deposited on the entirety of one surface of the flexible substrate 50 to form a thin film 55, as shown in FIG. 2.

Therefore, in order to adjust the size of the thin film 55 formed on the flexible substrate 50, an additional patterning process, for example, a photolithography process or a laser process, should be executed.

BRIEF SUMMARY

Accordingly, the present disclosure is directed to a roll-to-roll substrate deposition apparatus that substantially obviates one or more problems due to limitations and disadvantages of the related art.

In various embodiments, the present disclosure provides a roll-to-roll substrate deposition apparatus which may control the width and length of a deposition area so as to adjust the size of a thin film.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the various purposes of the disclosure, as embodied and broadly described herein, a roll-to-roll substrate deposition apparatus includes a chamber configured to receive a flexible substrate that is conveyed through the chamber. A deposition unit is disposed in the chamber and configured to supply a deposition material to a surface of a flexible substrate, and a deposition area controller is configured to adjust a width and a length of a deposition area in which a thin film formed of the deposition material is deposited on the surface of the flexible substrate.

The deposition area controller is disposed between the flexible substrate and the deposition unit within the chamber, and forms blocking areas in a deposition area defined on the surface of the flexible substrate so as to adjust the width and length of the thin film.

It is to be understood that both the foregoing general description and the following detailed description of the present disclosure are exemplary and explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

Reference will now be made in detail to the preferred embodiments of the present disclosure, examples of which are illustrated in the accompanying drawings.

Hereinafter, a roll-to-roll substrate deposition apparatus in accordance with one or more embodiments of the present disclosure will be described in detail.

Figure 1:
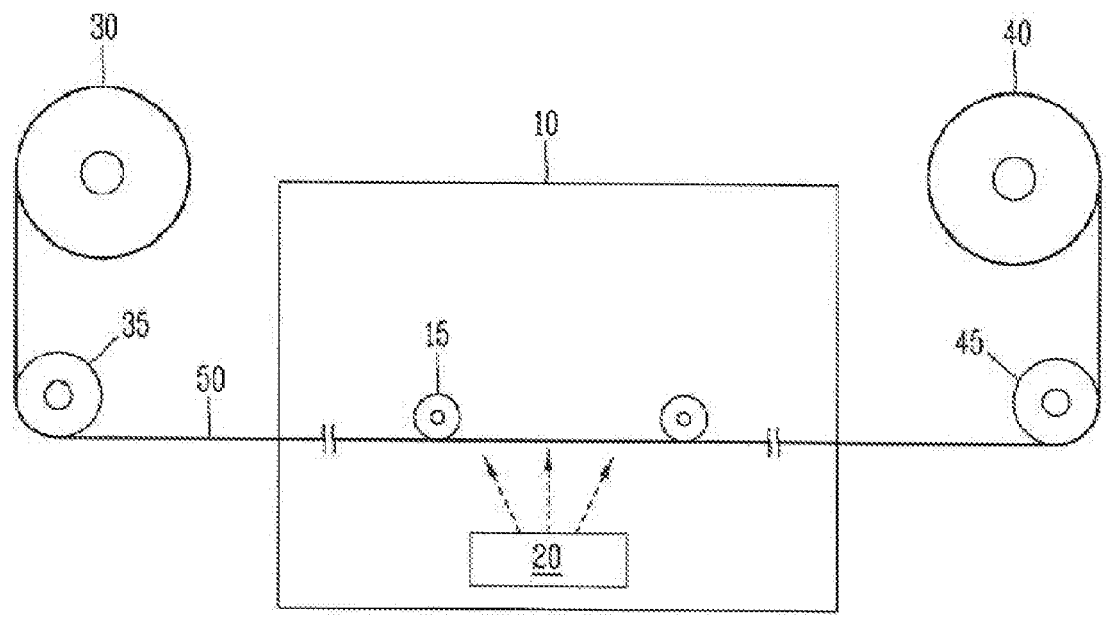
FIG. 1 is a view schematically illustrating a conventional roll-to-roll substrate deposition apparatus.
Figure 2:
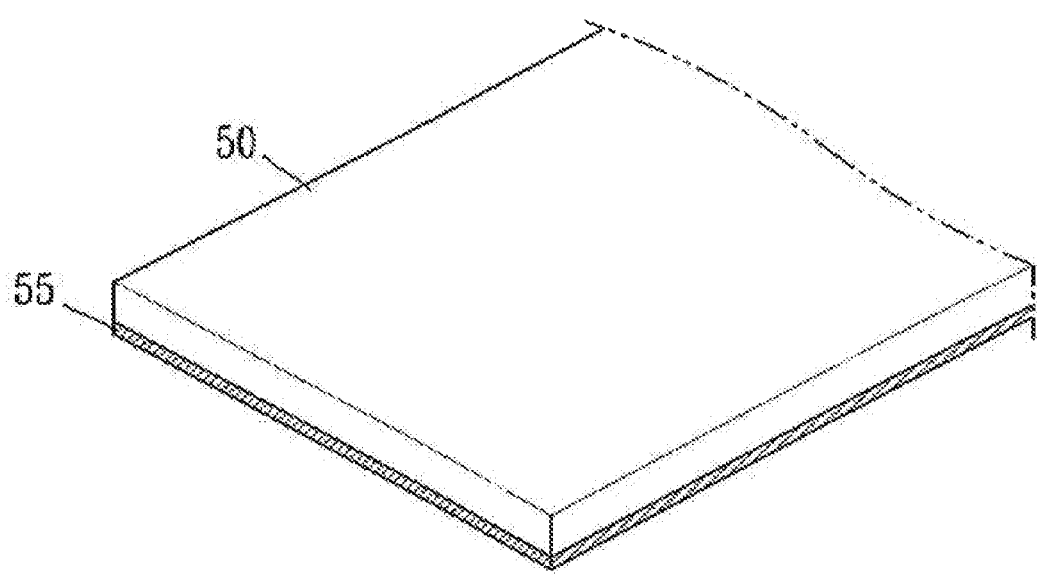
FIG. 2 is a view illustrating a part of a flexible substrate provided with a thin film formed thereon by the conventional roll-to-roll substrate deposition apparatus.
Figure 3:
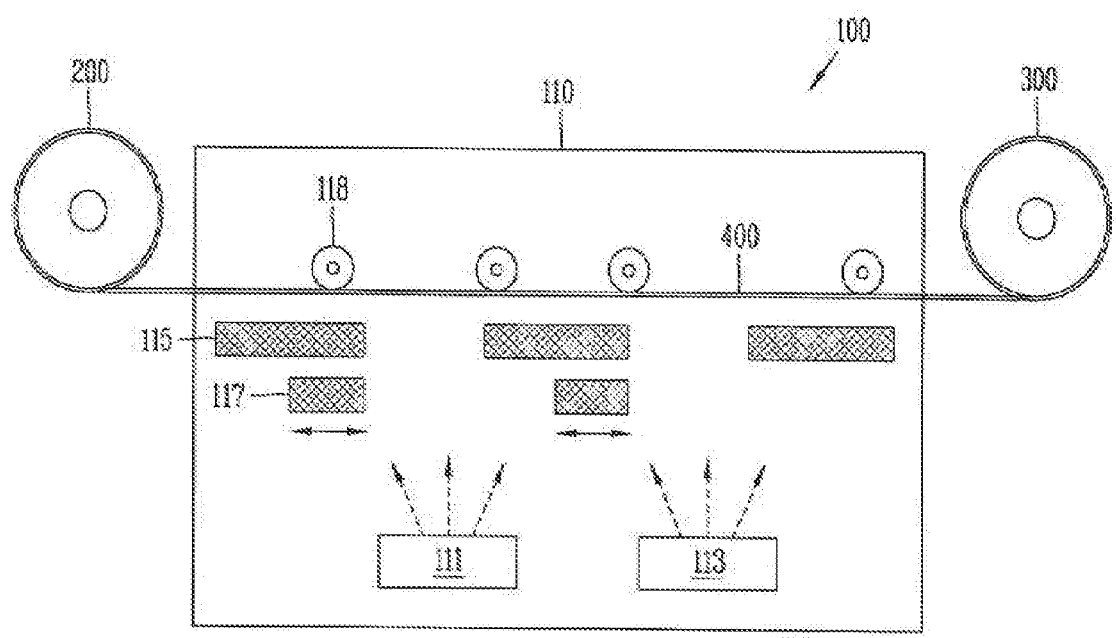
FIG. 3 is a view illustrating a roll-to-roll substrate deposition apparatus in accordance with one or more embodiments of the present disclosure.

FIG. 3 is a view illustrating a roll-to-roll substrate deposition apparatus in accordance with one or more embodiments of the present disclosure.

With reference to FIG. 3, a roll-to-roll substrate deposition apparatus 100 in accordance with embodiments may form a thin film (not shown) on one surface, for example, a rear surface, of a flexible substrate 400 successively supplied from an unwinding roller 200. The flexible substrate 400 provided with the thin film formed thereon may be supplied to a rewinding roller 300 through one or more transfer rollers 118. The flexible substrate 400 may be transferred in an in-line manner by the transfer rollers 118 within a chamber 110.

The substrate deposition apparatus 100 may include a depositor and a deposition area controller, which are disposed in the chamber 110.

The depositor may supply a deposition material to one surface of the flexible substrate 400 supplied to the inside of the chamber 110 from the unwinding roller 200 so as to form a thin film having a designated size. The depositor may include one or more deposition units, for example, a first deposition unit 111 and a second deposition unit 113.

The first deposition unit 111 and the second deposition unit 113 may supply the same deposition material or different deposition materials to one surface of the flexible substrate 400. Here, the first deposition unit 111 the second deposition unit 113 may supply a deposition material to one surface of the flexible substrate 400 exposed by the deposition area controller. Therefore, the deposition material is deposited on one surface of the flexible substrate 400 and, thus, a designated thin film may be formed. The deposition material supplied from the depositor may be an organic material or an inorganic material to form a thin film of organic light emitting diodes on one surface of the flexible substrate 400.

The deposition area controller may be disposed between the flexible substrate 400 and the depositor. The deposition area controller may control the area of the thin film formed on one surface of the flexible substrate, i.e., the size of a deposition area. The deposition area controller may include one or more control units, for example, first control units 115 and second control units 117.

The first control unit 115 may be a deposition width control unit to control the width of the deposition area. The first control unit 115 may have a rectangular frame shape which is formed by four side walls and provided with open upper and lower surfaces. An open area of the first control unit 115 may be defined as a deposition area.

The first control unit 115 may be disposed so as to be close to one surface of the flexible substrate 400. At least two side walls of the first control unit 115 may form blocking areas within the deposition area. The blocking areas formed by the first control unit 115 may correspond to both side parts of one surface of the flexible substrate 400. That is, the blocking areas of the first control unit 115, which are shown in hatching in FIG. 4, correspond to side portions of the first control unit 115 that overlap side or edge portions of the flexible substrate 400 when the flexible substrate 400 passes over the first control unit 115. Therefore, on one surface of the flexible substrate 400, the width of the deposition area may be controlled by the blocking areas of the first control unit 115.

Further, the two side walls forming the blocking areas of the first control unit 115, for examples, two side walls corresponding to both side parts of the flexible substrate 400, may move left/right in the width direction of the flexible substrate 400. Therefore, the width of the blocking areas formed by the first control unit 115 is variable and, thus, the width of the deposition area on one surface of the flexible substrate 400 may be adjusted as desired. The width of the blocking areas of the first control unit 115 may be varied, for example, by an electronic controller that is connected to the first control unit 115, or in some implementations, the width of the blocking areas of the first control unit 115 may be manually varied to a selected dimension.

The second control unit 117 may be a deposition length control unit to control the length of the deposition area. The second control unit 117 may have a bar shape and may be formed so as to be close to the lower surface of the first control unit 115.

The second control unit 117 may form a blocking area within the deposition area defined by the first control unit 115. The blocking area formed by the second control unit 117 may be an area corresponding to one surface of the flexible substrate 400 in the width direction. Therefore, on one surface of the flexible substrate 400, the length of the deposition area may be controlled by the blocking area of the second control unit 117.

Further, the second control unit 117 may move left/right in the length direction of the flexible substrate 400. Therefore, the position of the blocking area formed by the second control unit 117 is variable and, thus, the length of the deposition area on one surface of the flexible substrate 400 may be adjusted as desired. The length of the blocking area of the second control unit 117 may be varied, for example, by an electronic controller, or it may be manually varied to a selected dimension.

Figure 4:
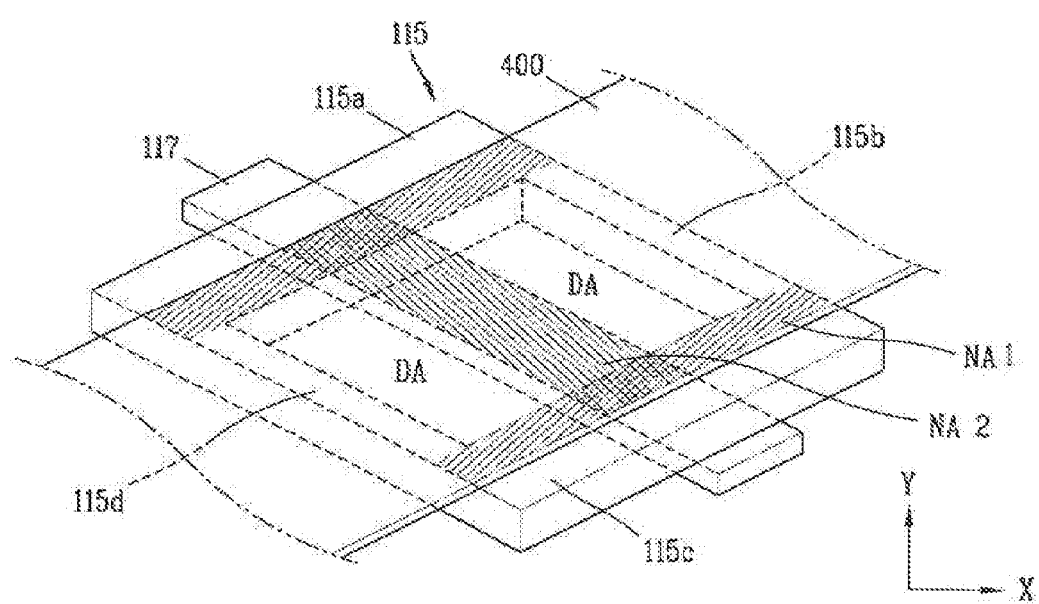
FIG. 4 is a view schematically illustrating a deposition area controller, in accordance with embodiments of the present disclosure.

FIG. 4 is a view schematically illustrating the deposition area controller.

With reference to FIG. 4, the first control unit 115 and the second control unit 117 of the deposition area controller may be disposed so as to correspond to one surface of the flexible substrate 400. Here, the first control unit 115 may be disposed so as to be close to one surface of the flexible substrate 400, and the second control unit 117 may be disposed so as to be close to the lower surface of the first control unit 115.

The first control unit 115 may have a rectangular frame shape formed by first to fourth side walls 115a to 115d. The first side wall 115a and the third side wall 115c of the first control unit 115 may correspond to both side parts of the flexible substrate 400. The second side wall 115b and the third side wall 115c of the first control unit 115 may be connected to the second side wall 115b and the third side wall 115c of a neighboring first control unit 115.

One surface of the flexible substrate 400 corresponding to an area exposed by the first control unit 115, i.e., the deposition area DA, may correspond to the respective deposition units 111 and 113 of the depositor. A deposition material supplied from the deposition units 111 and 113 may be deposited on the deposition area DA.

The first side wall 115a and the third side wall 115c of the first control unit 115 may form blocking areas corresponding to both side parts of one surface of the flexible substrate 400, for example, first blocking areas NA1. The first blocking areas NA1 may control the width of the deposition area DA, for example, the horizontal width of the deposition area DA. Therefore, the deposition material supplied from the depositor to one surface of the flexible substrate 400 may form a thin film in the deposition area DA, the width of which is adjusted by the first blocking areas NA1.

The second control unit 117 may have a bar shape and may be disposed below the first control unit 115 so as to intersect the first side wall 115a and the third side wall 115c. The second control unit 117 may form a blocking area corresponding to a designated area of one surface of the flexible substrate 400, for example, a second blocking area NA2. The second blocking area NA2 may control the length of the deposition area DA defined by the first control unit 15, for example, the vertical length of the deposition area DA. Therefore, the deposition material supplied from the depositor to one surface of the flexible substrate 400 may form a thin film in the deposition area DA, the length of which is adjusted by the second blocking area NA2.

The first control unit 115 and the second control unit 117 move in a designated direction with respect to one surface of the flexible substrate 400 and may thus vary the width and length of the deposition area DA. For this purpose, the deposition area controller may further include a movement controller (not shown), which may be an electronic controller for controlling the movement of the first control unit 115 and the second control unit 117, thereby controlling the dimensions of the deposition area DA.

In more detail, the first side wall 115a and the third side wall 115c of the first control unit 115 may move left/right in the width direction of the flexible substrate 400, for example, in the x-axis direction, under the control of the movement controller. Here, the first side wall 115a and the third side wall 115c may move in different directions and, thus, the width of the deposition area DA may be adjusted. Here, the x-axis direction, in which the first side wall 115a and the third side wall 115c move, may intersect the transfer direction of the flexible substrate 400 within the chamber 110.

Further, the second control unit 117 may move left/right in the length direction of the flexible substrate 400, for example, in the y-axis direction, under the control of the movement controller. Due to movement of the second control unit 117, the length of the deposition area DA formed on one surface of the flexible substrate 400 may be adjusted. Here, the y-axis direction, in which the second control unit 117 moves, may be equal to or reverse to the transfer direction of the flexible substrate 400 within the chamber 110. Further, the second control unit 117 may move in the y-axis direction synchronously with the transfer speed or movement distance of the flexible substrate 400

As described above, the substrate deposition apparatus 100 in accordance with this embodiment disposes the deposition area controller between the flexible substrate 400 supplied to the inside of the chamber 110 and the depositor supplying deposition materials to the flexible substrate 400 and may thus control the width and length of the deposition area DA. Therefore, the width and length of a thin film formed on one surface of the flexible substrate 400 corresponding to the deposition area may be controlled by the deposition area controller. Accordingly, the substrate deposition apparatus 100 in accordance with this embodiment may omit a subsequent patterning process, which is conventionally carried out to adjust the size of a thin film formed on the flexible substrate 400, and thereby simplify a thin film formation process, i.e., a deposition process, of the flexible substrate 400.

Further, the substrate deposition apparatus 100 in accordance with this embodiment may adjust the width and length of the thin film while moving the deposition area controller left/right with respect to the flexible substrate 400. Thereby, thin films having various sizes may be formed on one surface of the flexible substrate 400.

FIGS. 5A to 5F are cross-sectional views illustrating a deposition process of a flexible substrate using the roll-to-roll substrate deposition apparatus of FIG. 3.

Hereinafter, a deposition process using the first deposition unit 111 of the depositor will be described, for convenience of description, but it will be apparent to those skilled in the art that a deposition process using the second deposition unit 113 may be executed in the same manner.

Figure 5A:
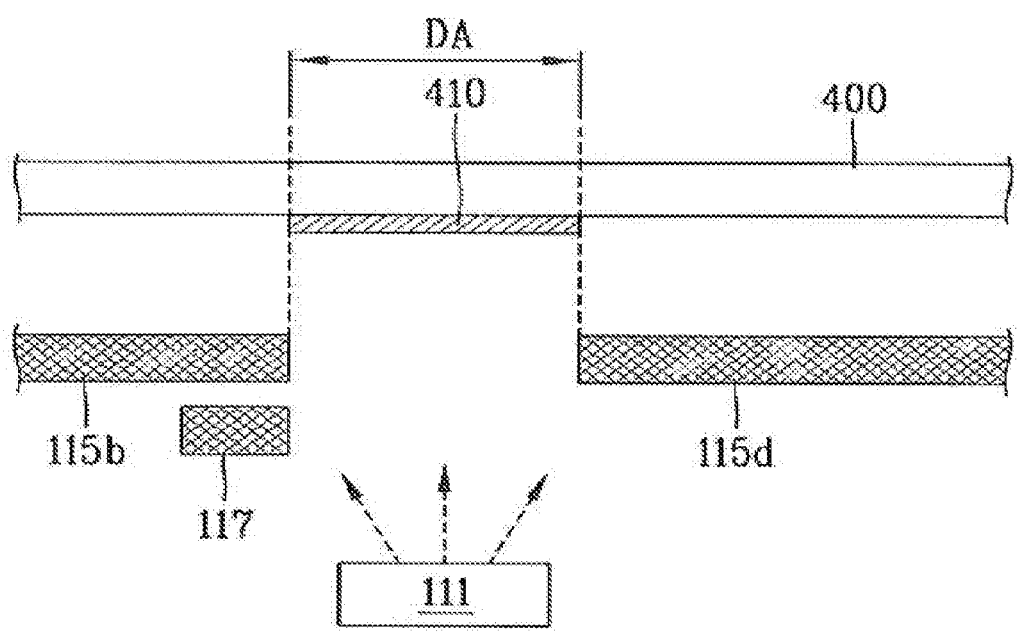
FIGS. 5A to 5F are cross-sectional views illustrating a deposition process of a flexible substrate using the roll-to-roll substrate deposition apparatus of FIG. 3.

As exemplarily shown in FIG. 5A, a deposition area DA is defined by the first control unit 115, and a deposition material supplied from the first deposition unit 111 forms a thin film corresponding to the deposition area DA on one surface of the flexible substrate 400, i.e., a first thin film 410.

Here, the second control unit 117 may be disposed below one side wall of the first control unit 115, for example, the second side wall 115b.

Figure 5B:
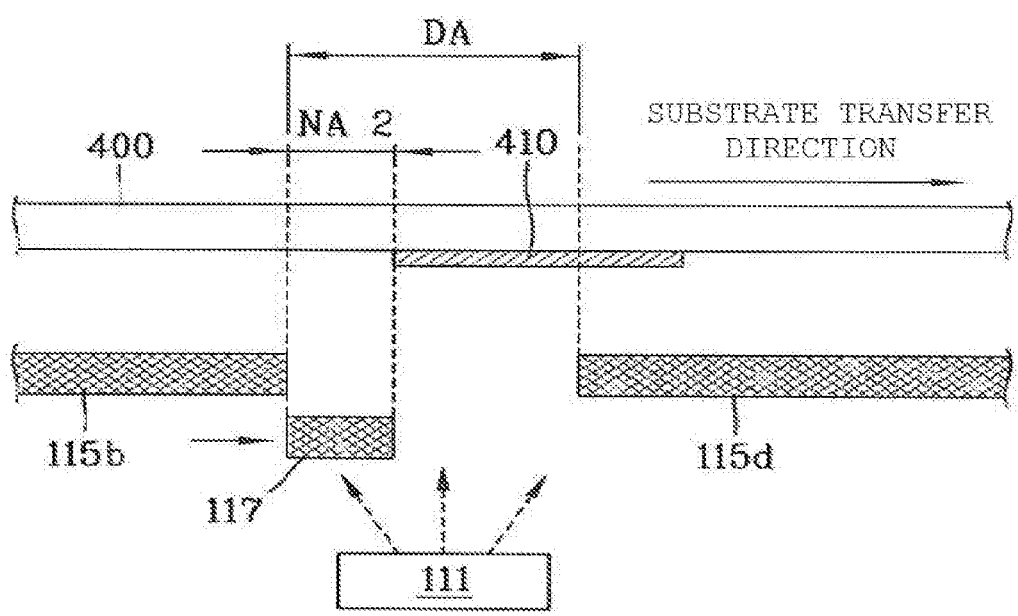
Figure 5C:
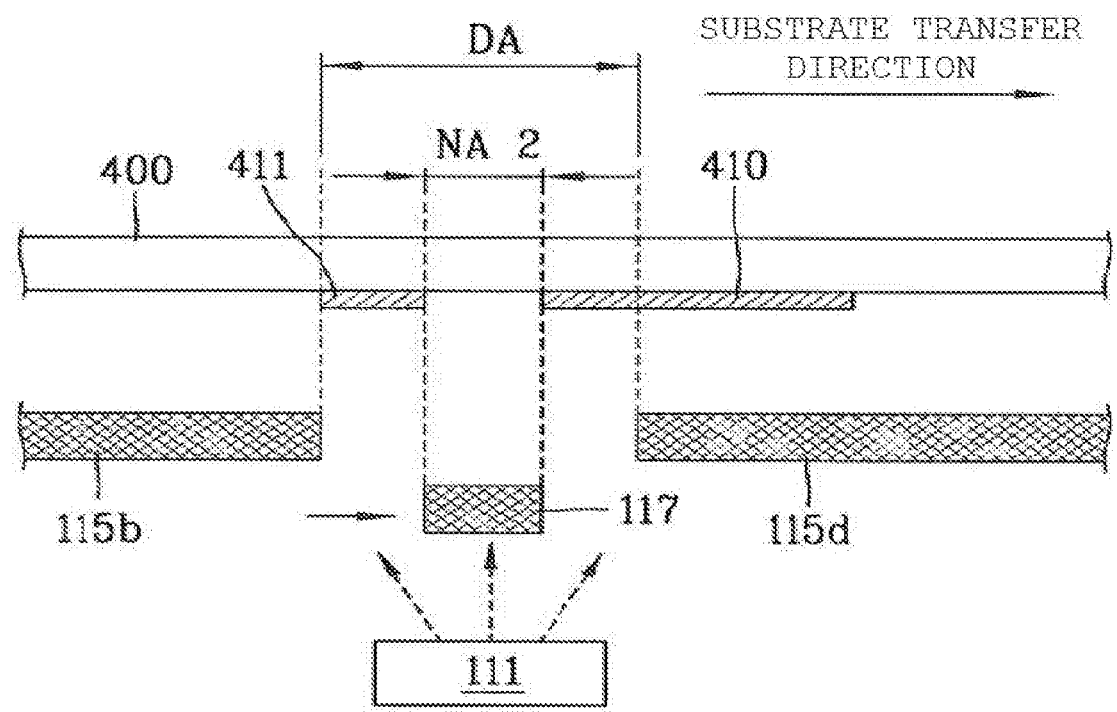
Figure 5D:
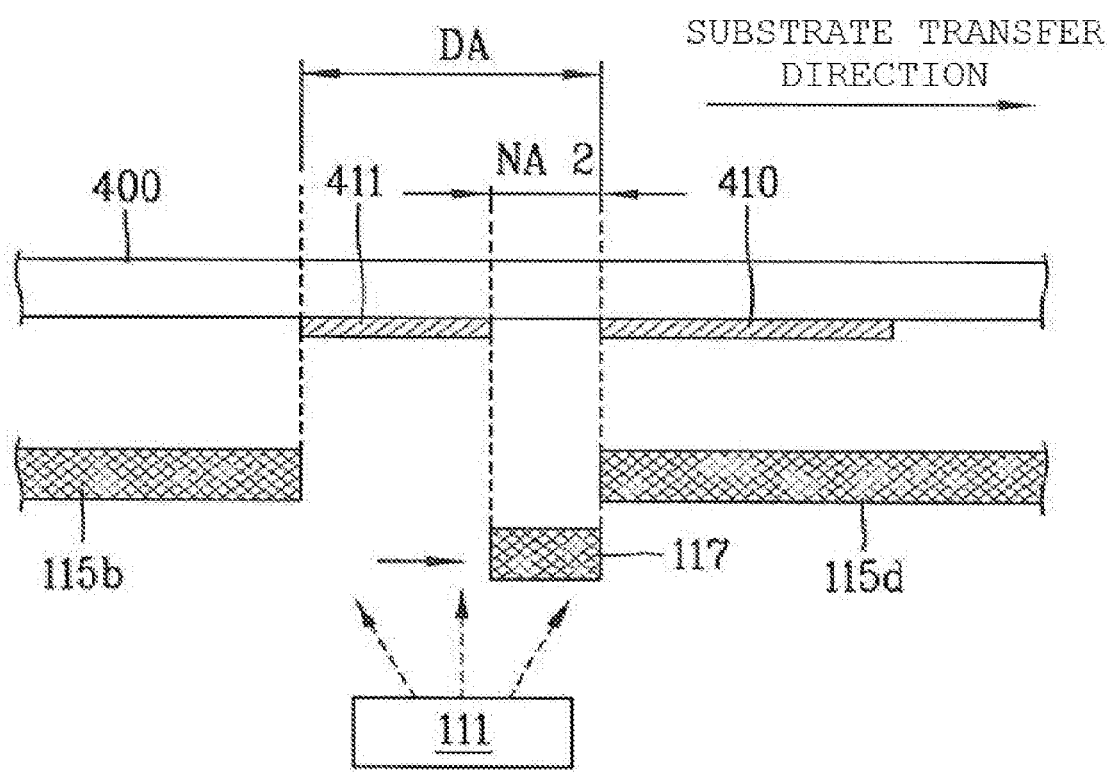

Thereafter, as exemplarily shown in FIGS. 5B to 5D, the flexible substrate 400 may be transferred in one direction by the transfer rollers 118 in the chamber 110. Here, the second control unit 117 may move in the same direction as the transfer direction of the flexible substrate 400. Thereby, a blocking area formed by the second control unit 117, i.e., a second blocking area NA2, may be formed in the deposition area DA.

Due to the second blocking area NA2 formed by the second control unit 117, the deposition material supplied from the first deposition unit 111 may be deposited in the remainder of the deposition area DA except for the second blocking area NA2.

Further, the second control unit 117 may move by the same distance as the movement distance of the flexible substrate 400. Therefore, the second blocking area NA2 formed by the second control unit 117 may move also.

Therefore, the first thin film 410 and a second thin film 411 are formed on one surface of the flexible substrate 400 using the deposition material supplied from the first deposition unit 111, and the lengths of the first thin film 410 and the second thin film 411 are adjusted by the second control unit 117 moving together with the flexible substrate 40 so that the first thin film 410 and the second thin film 411 may be formed so as to be spaced apart from each other.

Figure 5E:
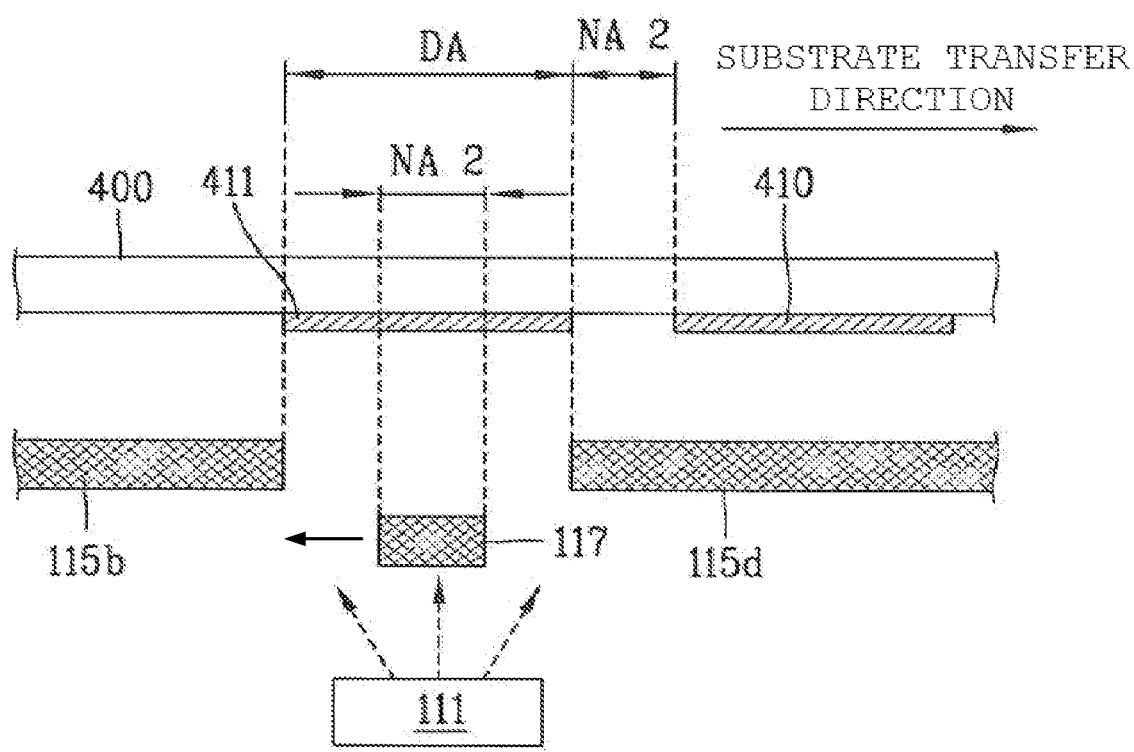
Figure 5F:
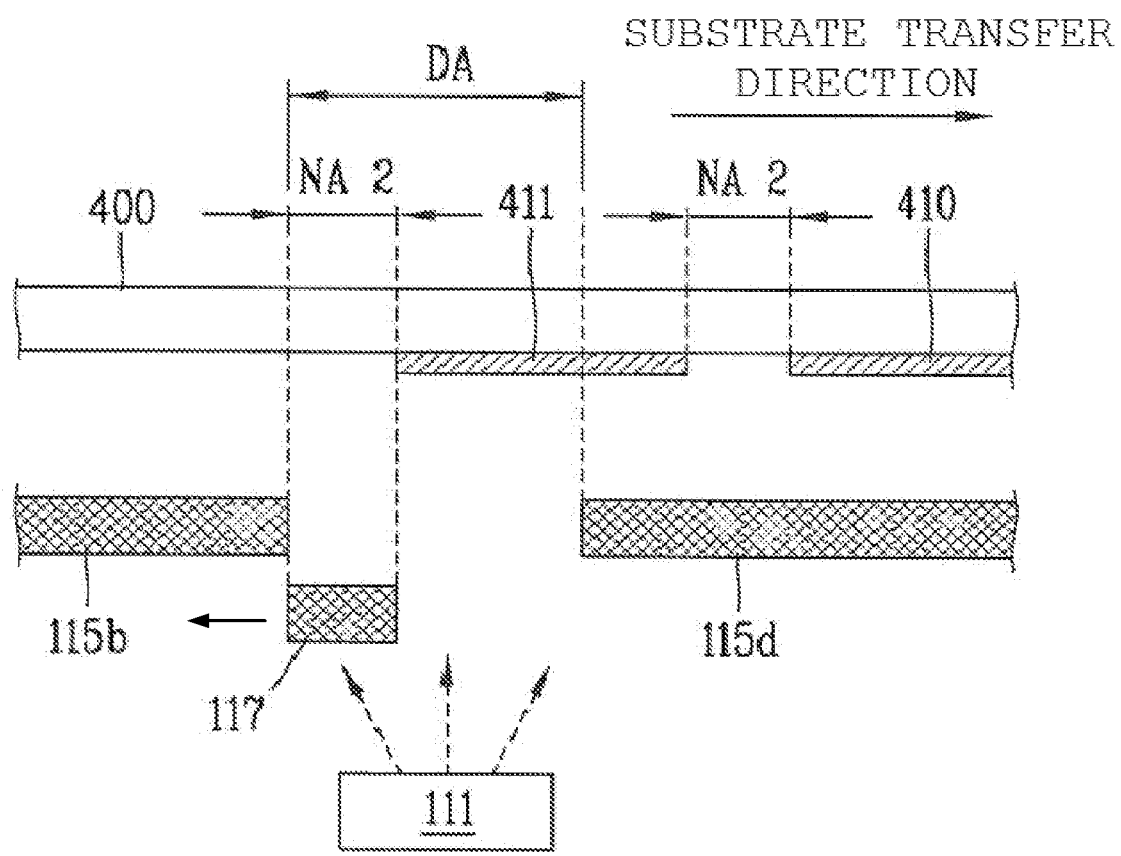

Thereafter, as exemplarily shown in FIGS. 5E and 5F, the second control unit 117 may move in the reverse direction to the transfer direction of the flexible substrate 400, contrary to the description with reference to FIGS. 5B to 5D. The second control unit 117 may move in the reverse direction to the transfer direction of the flexible substrate 400 by the same distance as the movement distance of the flexible substrate 400. Therefore, the second blocking area NA2 formed by the second control unit 117 may move in the reverse direction to the transfer direction of the flexible substrate 400.

Here, the deposition material should not be deposited on a part of one surface of the flexible substrate 400 corresponding to the second blocking area NA2. However, as exemplarily shown in FIGS. 5E and 5F, the deposition material, which is already supplied from the first deposition unit 111 in the earlier operation, is deposited on the part of one surface of the flexible substrate 400 corresponding to the second blocking area NA2 and may thus form the second thin film 411.

In more detail, the second thin film 411 may be formed on the part of one surface of the flexible substrate 400 corresponding to the second blocking area NA2 shown in FIG. 5E. Such a second thin film 411 may be already formed by depositing the deposition material in the deposition area DA on one surface of the flexible substrate 400 not corresponding to the second blocking area NA2 in FIG. 5D.

Further, the second thin film 411 may be formed on a part of one surface of the flexible substrate 400 corresponding to the second blocking area NA2 shown in FIG. 5F. Such a second thin film 411 may be already formed by depositing the deposition material in the deposition area DA on one surface of the flexible substrate 400 not corresponding to the second blocking area NA2 in FIG. 5E.

After operation of FIG. 5F has been carried out, the substrate deposition apparatus 100 repeats operations of FIGS. 5B to 5F, thus forming a plurality of thin films, the lengths of which are respectively controlled, on one surface of the flexible substrate 400.

As described above, the substrate deposition apparatus 100 in accordance with this embodiment forms a thin film by depositing a deposition material on one surface of the flexible substrate 400 transferred in one direction. The deposition area controller, for example, the second control unit 117, moves in the same direction as or reverse direction to the transfer direction of the flexible substrate 400 and, thus, the length of the thin film may be controlled. Therefore, the substrate deposition apparatus 100 may omit a subsequent patterning process to adjust the size of the thin film and control the movement speed or movement distance of the second control unit 117, thus forming thin films having various lengths.

Figure 6:
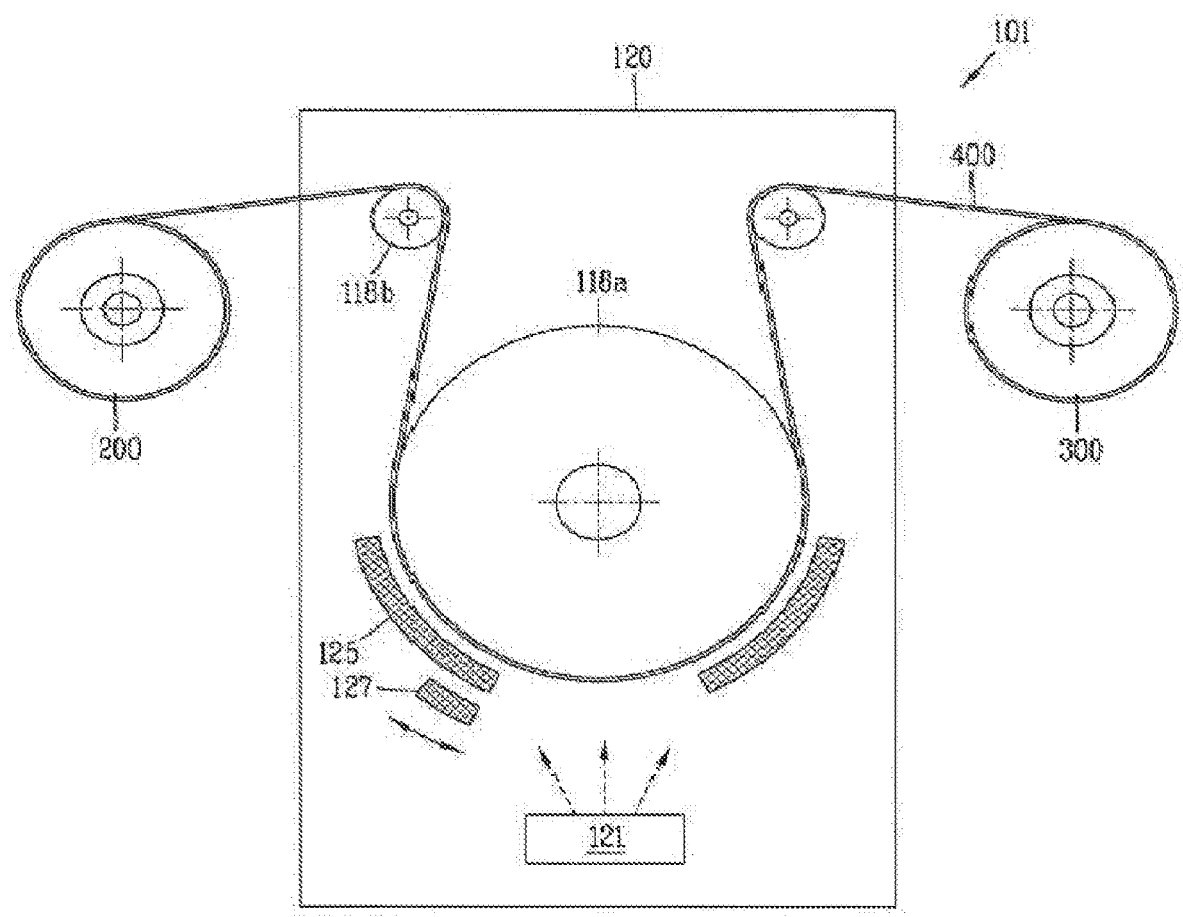
FIG. 6 is a view illustrating a roll-to-roll substrate deposition apparatus in accordance with another embodiment of the present disclosure.

FIG. 6 is a view illustrating a roll-to-roll substrate deposition apparatus in accordance with another embodiment of the present disclosure.

With reference to FIG. 6, a roll-to-roll substrate deposition apparatus 101 in accordance with this embodiment may form a thin film (not shown) by depositing a deposition material on one surface of a flexible substrate 400 successively supplied from an unwinding roller 200. The flexible substrate 400 provided with the thin film formed thereon may be supplied to a rewinding roller 300. The flexible substrate 400 may be transferred along the outer circumferential surface of a drum 118*a* within a chamber 120.

The substrate deposition apparatus 101 may include the drum 118*a*, a deposition unit 121 and a deposition area controller, which are disposed in the chamber 120.

The drum 118*a* may be formed to have a cylindrical shape. The drum 118*a* is rotated in a designated direction, rotates the flexible substrate 400 supplied through a transfer roller 118*b* along the outer circumferential surface thereof, and thus supplies the flexible substrate 400 to the rewinding roller 300 through another transfer roller 118*b*.

The deposition unit 121 may be disposed below the drum 118*a* and supply the deposition material to one surface of the flexible substrate 400 transferred along the outer circumferential surface of the drum 118*a* so as to form a designated thin film. The deposition material supplied from the deposition unit 121 may be an organic material or an inorganic material to form a thin film of organic light emitting diodes on one surface of the flexible substrate 400.

The deposition area controller may be disposed between the flexible substrate 400 and the deposition unit 121. The deposition area controller may control the area of the thin film formed on one surface of the flexible substrate 400 by the deposition unit 121. The deposition area controller may include first control units 125 and second control units 127.

The first control unit 125 may be disposed so as to be close to the flexible substrate 400 transferred along the outer circumferential surface of the drum 118*a*. The first control unit 125 may define a deposition area of one surface of the flexible substrate 400 corresponding to the deposition unit 121. Further, the first control unit 125 may form blocking areas in the remainder of one surface of the flexible substrate 400 except for the deposition area. The blocking areas may be formed so as to surround the outer circumferential surface of the drum 118*a*. The blocking areas formed by the first control unit 125 may adjust the width of a thin film formed in the deposition area. The first control unit 125 may be a deposition width control unit.

The second control unit 127 may be disposed so as to be close to the lower surface of the first control unit 125. The second control unit 127 moves left/right in the same direction as or reverse direction to the transfer direction of the flexible substrate 400, i.e., the rotating direction of the drum 118*a*, within the deposition area defined by the first control unit 125, thus forming a blocking area. The blocking area formed by the second control unit 127 may adjust the length of a thin film formed in the deposition area. The second control unit 127 may be a deposition length control unit.

Further, the second control unit 127 may move left/right synchronously with the transfer speed or transfer distance of the flexible substrate 400 transferred according to rotation of the drum 118*a*. In the substrate deposition apparatus 101 in accordance with this embodiment, movement of the second control unit 127 is substantially equal to movement of the second control unit 117 described above with reference to FIGS. 5A to 5F and a detailed description thereof will thus be omitted.

As described above, the substrate deposition apparatus 101 in accordance with this embodiment disposes the deposition area controller between the flexible substrate 400 supplied to the inside of the chamber 120 and transferred through rotation of the drum 118*a* and the deposition unit 121 supplying a deposition material to the flexible substrate 400 and may thus control the width and length of the deposition area DA of the deposition material. Therefore, the width and length of a thin film formed on one surface of the flexible substrate 400 corresponding to the deposition area may be controlled by the deposition area controller. Accordingly, the substrate deposition apparatus 101 in accordance with this embodiment may omit a subsequent patterning process, which is conventionally carried out to adjust the size of a thin film formed on the flexible substrate 400, and thereby simplify a deposition process of the flexible substrate 400.

Further, the substrate deposition apparatus 101 in accordance with this embodiment may adjust the length of the thin film while moving the deposition area controller, for example, the second control unit 127, left/right according to the transfer speed, direction and distance of the flexible substrate 400. Thereby, thin films having various sizes may be formed on one surface of the flexible substrate 400.

As apparent from the above description, a roll-to-roll substrate deposition apparatus in accordance with the present disclosure disposes a deposition area controller between a flexible substrate supplied to the inside of a chamber and a deposition unit supplying a deposition material to the flexible substrate so as to control the width and length of a deposition area of the deposition material, and may thus control the width and length of a thin film formed on one surface of the flexible substrate corresponding to the deposition area. Accordingly, the roll-to-roll substrate deposition apparatus in accordance with the present disclosure may omit a subsequent patterning process, which is conventionally carried out to adjust the size of a thin film formed on the flexible substrate, and thereby simplify a deposition process of the flexible substrate.

Further, the roll-to-roll substrate deposition apparatus in accordance with the present disclosure may adjust the width and length of the deposition area while moving the deposition area controller left/right with respect to the flexible substrate. Thereby, thin films having various sizes may be formed on one surface of the flexible substrate.

It will be apparent to those skilled in the art that various modifications and variations can be made in the present disclosure without departing from the spirit or scope of the disclosure. Thus, it is intended that the present disclosure cover the modifications and variations of this disclosure provided they come within the scope of the appended claims and their equivalents.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A roll-to-roll substrate deposition apparatus, comprising:
    a chamber configured to receive a flexible substrate that is conveyed through the chamber;
    a depositor disposed in the chamber and configured to supply a deposition material to a surface of the flexible substrate; and
    a deposition area controller disposed between the flexible substrate and the depositor and configured to adjust a width and a length of a deposition area in which a film formed of the deposition material is deposited on the surface of the flexible substrate,
    wherein the deposition area controller includes:
        a first controller including a plurality of side walls and defining a deposition opening over the surface of the flexible substrate, two of the side walls forming first blocking areas to control the width of the deposition area in the deposition opening; and
        a second controller disposed below the first controller and arranged to intersect the two side walls, the second controller forming a second blocking area to control the length of the deposition area, the second controller being narrower than the deposition opening along a length direction of the deposition opening, the second controller configured to divide the deposition opening into two separate portions to form a first portion of the deposition area between a first side of the second controller and a first side wall of the first controller and a second portion of the deposition area between a second side of the second controller and a second side wall of the first controller,
    wherein the deposition opening comprises the second blocking area and the deposition area,
    wherein the deposition material is supplied from the depositor to the surface of the flexible substrate through the deposition area of the deposition opening.

2. The roll-to-roll substrate deposition apparatus according to claim 1, wherein the first blocking areas correspond to edge portions of the flexible substrate.

3. The roll-to-roll substrate deposition apparatus according to claim 1, wherein the two side walls are movable in a width direction of the flexible substrate to adjust the width of the first blocking areas.

4. The roll-to-roll substrate deposition apparatus according to claim 3, wherein the width direction of the flexible substrate intersects a transfer direction in which the flexible substrate is conveyed through the chamber.

5. The roll-to-roll substrate deposition apparatus according to claim 1, wherein the second controller is movable along the length direction of the deposition opening to adjust the position of the second blocking area, and the flexible substrate has a length direction that corresponds to the length direction of the deposition opening.

6. The roll-to-roll substrate deposition apparatus according to claim 5, wherein the length direction of the flexible substrate is the same as or reverse to a transfer direction in which the flexible substrate is conveyed through the chamber.

7. The roll-to-roll substrate deposition apparatus according to claim 5, wherein the second controller moves synchronously with a transfer distance of the flexible substrate.

8. The roll-to-roll substrate deposition apparatus according to claim 1, wherein the chamber is formed in an in-line type and includes one or more transfer rollers to transfer the flexible substrate.

9. The roll-to-roll substrate deposition apparatus according to claim 1, wherein the chamber is formed in a drum type and includes a drum to transfer the flexible substrate.

10. An apparatus, comprising:
    a chamber configured to receive a flexible substrate that is conveyed through the chamber;
    a depositor in the chamber and configured to supply a deposition material to a surface of the flexible substrate; and
    a deposition area controller between the flexible substrate and the depositor, the deposition area controller including:
        a first deposition control structure having a first pair of opposing sides spaced apart from one another along a first direction and a second pair of opposing sides spaced apart from one another along a second direction that is transverse to the first direction, the first pair of opposing sides defining a width of a deposition opening along the first direction, the second pair of opposing sides defining a length of the deposition opening along the second direction; and
        a second deposition control structure movable across the length of the deposition opening, the second deposition control structure having a length between opposite sides along the second direction that is less than the length of the deposition opening along the second direction,
    wherein the deposition opening comprises a blocking area and at least one deposition area,
    wherein the blocking area is formed by the position of the second deposition control structure and the second deposition control structure is configured to divide the deposition opening into two separate portions to form a first deposition area between the second deposition control structure and a first side of the second pair of opposing sides, and to form a second deposition area between the second deposition control structure and a second side of the second pair of opposing sides,
    wherein the deposition material is supplied from the depositor to the surface of the flexible substrate through the deposition area of the deposition opening.

11. The apparatus according to claim 10, wherein the first pair of opposing sides of the first deposition control structure are movable along the first direction, the width of the deposition opening being variable based on movement of the first pair of opposing sides of the first deposition control structure.

12. The apparatus according to claim 10, wherein the length of the second deposition control structure is less than a width of the second deposition control structure.

13. The apparatus according to claim 10, wherein, in use, the deposition material is deposited on the surface of the flexible substrate in the first deposition area and in the second deposition area.

14. The apparatus according to claim 10, wherein, in use, the flexible substrate is conveyed through the chamber along the second direction.

15. The apparatus according to claim 14, wherein the second deposition control structure moves synchronously with a transfer distance of the flexible substrate.

16. The apparatus according to claim 10, wherein the first direction is perpendicular with respect to the second direction, and the deposition opening is rectangular.

17. The apparatus according to claim 10, wherein at least one of the first deposition control structure or the second deposition control structure is movable in response to an electronic controller.

18. The apparatus according to claim 10, wherein the first deposition control structure is disposed between the flexible substrate and the second deposition control structure.

* * * * *